United States Patent
Jia et al.

(10) Patent No.: US 9,973,362 B2
(45) Date of Patent: May 15, 2018

(54) COMMON BROADCAST CHANNEL LOW PAPR SIGNALING IN MASSIVE MIMO SYSTEMS

(71) Applicant: Huawei Technologies Co., Ltd., Shenzhen (CN)

(72) Inventors: Ming Jia, Ottawa (CA); Jianglei Ma, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days. days.

(21) Appl. No.: 14/490,483

(22) Filed: Sep. 18, 2014

(65) Prior Publication Data
US 2016/0087829 A1   Mar. 24, 2016

(51) Int. Cl.
| | | |
|---|---|---|
| *H04B 7/04* | (2017.01) | |
| *H04B 1/04* | (2006.01) | |
| *H04L 27/26* | (2006.01) | |
| *H04W 52/02* | (2009.01) | |
| *H04B 7/0452* | (2017.01) | |
| *H04B 7/06* | (2006.01) | |

(52) U.S. Cl.
CPC ....... *H04L 27/2623* (2013.01); *H04B 1/0483* (2013.01); *H04B 7/0452* (2013.01); *H04B 7/0617* (2013.01); *H04L 27/2626* (2013.01); *H04W 52/028* (2013.01); *H04B 2001/0408* (2013.01); *Y02B 60/50* (2013.01)

(58) Field of Classification Search
CPC ............... H04L 27/2614; H04L 5/0023; H04L 27/2623; H04L 27/2626; H04B 7/0413; H04B 7/06; H04B 7/0613; H04B 7/0615; H04B 7/0452; H04B 1/0483; H04B 2001/0408; H04W 52/028
USPC .................................................. 375/260, 267
See application file for complete search history.

(56) References Cited

U.S. PATENT DOCUMENTS

| | | | |
|---|---|---|---|
| 2006/0050799 A1 | 3/2006 | Hou et al. | |
| 2008/0032744 A1* | 2/2008 | Khan ................... | H04B 7/0615 455/562.1 |
| 2008/0130767 A1 | 6/2008 | Lozhkin | |
| 2010/0182966 A1* | 7/2010 | Kishiyama ........... | H04J 11/0076 370/329 |
| 2010/0273506 A1* | 10/2010 | Stern-Berkowitz ... | G01S 5/0009 455/456.1 |

(Continued)

FOREIGN PATENT DOCUMENTS

| | | |
|---|---|---|
| CN | 101027868 A | 8/2007 |
| CN | 101340621 A | 1/2009 |

(Continued)

OTHER PUBLICATIONS

International Search Report for Application No. PCT/CN2015/089353, dated Dec. 11, 2015, 12 pages.

(Continued)

*Primary Examiner* — Betsy Deppe
(74) *Attorney, Agent, or Firm* — Slater Matsil LLP

(57) ABSTRACT

Methods and devices for common channel low PAPR signaling are disclosed having a power amplifier set configured to transmit broad-beam signals over a frequency band narrower than the available bandwidth and modulated with a low PAPR sequence. A second power amplifier set may be configured to transmit narrow-beam unicast signals.

31 Claims, 5 Drawing Sheets

(56) References Cited

U.S. PATENT DOCUMENTS

| | | | |
|---|---|---|---|
| 2011/0007704 A1* | 1/2011 | Swarts | H04J 11/0073 370/330 |
| 2011/0075650 A1* | 3/2011 | Zhu | H04L 25/0246 370/344 |
| 2011/0092231 A1 | 4/2011 | Yoo et al. | |
| 2011/0116438 A1* | 5/2011 | Tsunekawa et al. | 370/312 |
| 2011/0141876 A1* | 6/2011 | Kuchi | H04B 7/0413 370/203 |
| 2011/0222588 A1* | 9/2011 | Ko | H04B 7/0689 375/135 |
| 2011/0228863 A1* | 9/2011 | Papasakellariou | H04L 1/0031 375/259 |
| 2012/0046047 A1* | 2/2012 | Popovic | G01S 5/0226 455/456.1 |
| 2012/0195395 A1* | 8/2012 | Baldemair | H04L 27/2618 375/296 |
| 2012/0263140 A1 | 10/2012 | Nishio et al. | |
| 2013/0279441 A1* | 10/2013 | Lee | H04W 72/042 370/329 |
| 2014/0269249 A1* | 9/2014 | Bai et al. | 370/329 |
| 2014/0341174 A1* | 11/2014 | Jonsson | H04L 5/0007 370/330 |
| 2015/0103723 A1* | 4/2015 | Kim | H04W 4/06 370/312 |
| 2015/0223176 A1* | 8/2015 | Janani | H04W 52/226 455/127.1 |

FOREIGN PATENT DOCUMENTS

| | | |
|---|---|---|
| CN | 103595677 A | 2/2014 |
| EP | 2056553 A1 | 5/2009 |
| JP | 2006287895 A | 10/2006 |
| JP | 2008060846 A | 3/2008 |
| JP | 2008141415 A | 6/2008 |
| WO | 2008134976 A1 | 11/2008 |
| WO | 2013025547 A2 | 2/2013 |

OTHER PUBLICATIONS

Kim, D., et al.,"Superposition of Broadcast and Unicast in Wireless Cellular Systems", Advances in Mobile Multimedia,Broadcasting:Part 2,IEEE Communication Magazine, Jul. 2008,total 8 pages.

* cited by examiner

COMMON BROADCAST CHANNEL LOW PAPR SIGNALING IN MASSIVE MIMO SYSTEMS

TECHNICAL FIELD

The present disclosure relates generally to wireless communications, and more particularly to low Peak-to-Average-Power-Ratio (PAPR) signaling for common broadcast channels in massive Multiple-Input Multiple-Output (MIMO) systems.

BACKGROUND

Multiple-input multiple-output (MIMO) systems use multiple antennas at both the transmitter and receiver of a wireless network to improve signal performance (e.g., spectral efficiency, link reliability, etc.) through the exploitation of spatial diversity. More specifically, MIMO offers significant increases in data throughput and link range without additional bandwidth or increased transmit power. Large scale antenna systems known as Massive MIMO (also referred to as very large MIMO, and hyper MIMO) use a very large number of service antennas at the base station (e.g., hundreds or thousands) with respect to the number of user equipment serviced (e.g., tens or hundreds) to focus the transmission and reception of signal energy into ever-smaller regions of space bringing improvements in throughput and energy efficiency. Other benefits of M-MIMO include that M-MIMO designs allow for the extensive use of inexpensive low-power components, reduced latency, simplification of the media access control (MAC) layer, and robustness to intentional jamming. Accordingly, techniques for integrating M-MIMO systems into next-generation wireless networks are desired.

Power density is a value used to describe how the transmit power in a communications signal is distributed over frequency. It is expressed in terms of power divided by a relatively small unit of bandwidth (e.g. dBW/kHz) and is usually referenced to the input of the antenna. The unit dBW, or dB-Watts, is the universally accepted way of expressing power on a log 10 scale (dBW=10 log 10 [PWatts]). The speed at which digital information flows is the data rate of the signal. In general, as the data rate of a signal increases, so does the range of frequencies occupied by that signal. Assuming total power in the signal is constant; increasing the data rate will spread power over a wider range of frequencies and decrease power density. The inverse is also true.

According to The Third Generation Partnership Project (3GPP) Technical Specification Group Radio Access Network, Requirements for Further Advancements for E-UTRA (LTE-Advanced or LTE-A), Release-10 (3GPP TR 36.913 V8.0.0 (2008 June)), LTE-Advanced networks should target a downlink (DL) peak data rate of 1 Gbps. In order to provide the improved data rates, LTE-Advanced introduces "multicarrier" which refers to the aggregation of multiple carriers to increase data rates. However, multi-carrier signals exhibit high peak-to-average-power-ratio (PAPR) and require expensive highly linear power amplifiers. Linear power amplifiers are also very power inefficient.

Known techniques of PAPR reduction include peak windowing, scaling, and clipping but such techniques induce interference and introduce distortion in an OFDM signal and require the signal to undergo filtering to reduce the interference and distortion to an acceptable level. Block coding is another technique to reduce PAPR.

Common broadcast signals for LTE/LTE-Advanced will now be described. Long Term Evolution (LTE), as defined by the Third Generation Partnership Project (3GPP) has two procedures for cell searching. One is for initial synchronization and the other for detecting neighbor cells in preparation for handover. In both cases, the User Equipment (UE) uses two common broadcast signals from neighboring cells, namely, a Primary Synchronization Signal (PSS) and a Secondary Synchronization Signal (SSS). The PSS and SSS signals are transmitted twice per ten millisecond radio frame and are fixed at the central sixty-two subcarriers of the channel. The detection of these signals allows the UE to complete time and frequency synchronization and to acquire useful system parameters such as cell identity, cyclic prefix length, and access mode (FDD/TDD).

The UE also decodes the Physical Broadcast Control Channel (PBCH) common broadcast signal from which it obtains important system information. The PBCH is transmitted using a Space Frequency Block Code (SFBC), which repeats every forty milliseconds, and carries what is termed as the Master Information Block (MIB) message. The MIB message on the PBCH is mapped onto the central seventy-two subcarriers of the channel.

The Physical Downlink Control Channel (PDCCH) common broadcast signal carries the resource assignment for UEs which are contained in a Downlink Control Information (DCI) message. The System Information Radio Network Temporary Identifier (SI-RNTI) is sent on the PDCCH and signals to all UEs in a cell where the broadcast System Information Blocks (SIBs) are found on the Physical Downlink Shared Channel (PDSCH).

The Physical Downlink Shared Channel (PDSCH) common broadcast signal is the main data bearing channel which is allocated to users on a dynamic and opportunistic basis. The PDSCH carries data in so-called Transport Blocks (TB).

Techniques to reduce peak-to-average power ratio (PAPR) should be low in complexity and cause minimal performance degradation and out-of-band radiation. Clipping is the simplest method to reduce PAPR but causes out-of-band radiation due to non-linear processing. Phase rotation techniques search the optimum set of phase factors. However, the search complexity of the optimum phase increases exponentially with the number of sub-blocks, and the phase factors in the receiver must be known.

An active constellation extension (ACE) technique can reduce PAPR by extending a constellation point toward the outside of the original constellation. Compared with the previously mentioned techniques, ACE induces no BER degradation and requires no special processing. However, it introduces a power increase and high complexity because of an iterative constellation extension process.

Accordingly, there is a need to provide common broadcast channel low PAPR signaling in MIMO systems while relaxing the power amplifier ratings.

SUMMARY

Systems and methods of low Peak-to-Average-Power-Ratio (PAPR) signaling of common broadcast channels in Multiple-Input Multiple-Output (MIMO) systems are disclosed.

A transmitter has a power amplifier set configured to transmit broad-beam signals over a frequency band narrower than the available bandwidth and the broad-beam signals are modulated with a low PAPR mechanism.

According to an embodiment, the Multiple-Input Multiple-Output (MIMO) transmitter has a number of antennas greater than a number of User Equipment (UE) serviced by the transmitter.

According to an embodiment, a low PAPR mechanism for modulating broad-beam signals is Quadrature Phase Shift Keying (QPSK) modulation with aggressive clipping.

According to an embodiment, the transmitter has a second power amplifier set configured to amplify narrow beam signals.

According to an embodiment, user equipment (UE) receives broadcast signals over a frequency band narrower than an available bandwidth and demodulates the broadcast signals for content.

According to an embodiment, the UE employs a DFT-S-OFDM demodulator to demodulate the received broadcast signals.

According to an embodiment, systems and methods for use in a wireless access network include providing a sequence having a low peak-to-average-power-ratio (PAPR) to enable efficient transmission over an orthogonal frequency division multiple access (OFDMA)-based wireless link of the wireless access network.

Other or alternative features will become apparent from the following description, from the drawings, and from the claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
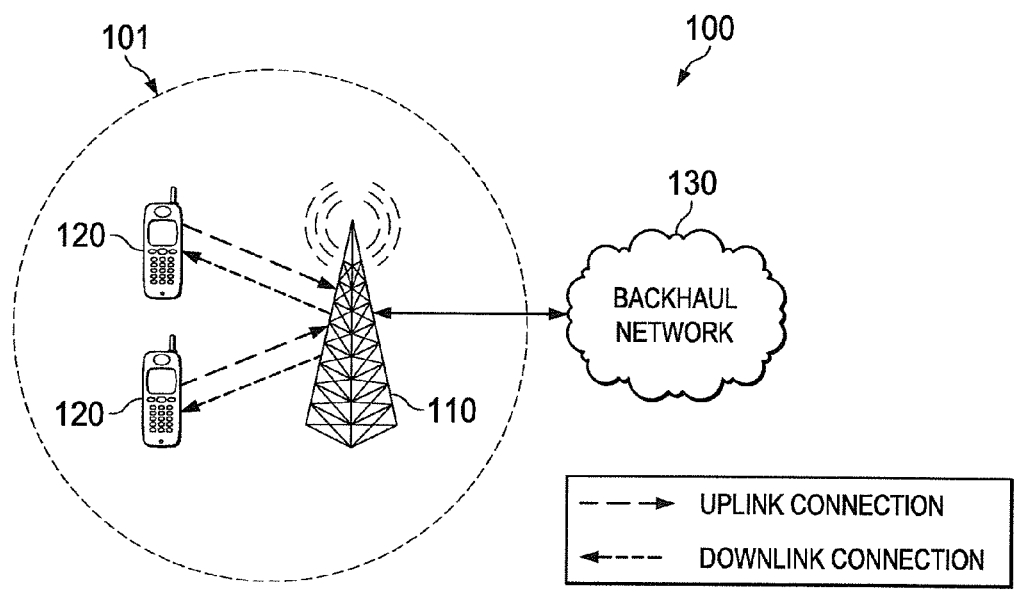
FIG. 1 illustrates a diagram of an embodiment wireless communications network.

It may be advantageous to set forth definitions of certain words and phrases used throughout this disclosure. The terms "include" and "comprise", as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

Unless defined otherwise, all technical and scientific terms used herein have the same meaning as commonly understood by a Person Having Ordinary Skill in the Art (PHOSITA) to which this disclosure belongs. Although any methods and materials similar or equivalent to those described herein can also be used in the practice or testing of the present disclosure, a limited number of the exemplary methods and materials are described herein.

As will be appreciated by a PHOSITA, aspects of the present disclosure may be embodied as a method, system, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module", "mechanism" or "system". Field Programmable Gate Arrays (FPGAs), Application Specific Integrated Circuits (ASICs), Digital Signal Processors (DSPs) and general purpose processors alone or in combination, along with associated software, firmware and glue logic may be used to construct the present disclosure.

Furthermore, aspects of the present disclosure may take the form of a computer program product on a computer-usable storage medium having computer-usable program code embodied in the medium. Any suitable computer usable or computer readable medium may be utilized. The computer-usable or computer-readable medium may be, for example but not limited to, a random access memory (RAM), a read-only memory (ROM), or an erasable programmable read-only memory (EPROM or Flash memory).

Computer program code for carrying out operations of the present disclosure may be written in, for example but not limited to, an object oriented programming language, conventional procedural programming languages, such as the "C" programming language or other similar programming languages.

All publications mentioned herein are incorporated herein by reference to disclose and describe the methods and/or materials in connection with which the publications are cited. The publications discussed herein are provided solely for their disclosure prior to the filing date of the present application.

Reference throughout this specification to "one embodiment", "an embodiment", "a specific embodiment", or "particular embodiment" means that a particular feature, structure, or characteristic described in connection with the particular embodiment is included in at least one embodiment and not necessarily in all particular embodiments. Thus, respective appearances of the phrases "in a particular embodiment", "in an embodiment", or "in a specific embodiment" in various places throughout this specification are not necessarily referring to the same embodiment. Furthermore, the particular features, structures, or characteristics of any specific embodiment may be combined in any suitable manner with one or more other particular embodiments. It is to be understood that other variations and modifications of the particular embodiments described and illustrated herein are possible in light of the teachings herein and are to be considered as part of the spirit and scope.

Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be configured to perform the task even when the specified unit/circuit/component is not currently operational (e.g., is not on). The units/circuits/components used with the "configured to" language include hardware—for example, circuits, memory storing program instructions executable to implement the operation, etc.

Reciting that a unit/circuit/component is "configured to" perform one or more tasks is expressly intended not to invoke 35 U.S.C. 112(f), for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are configured to implement or perform one or more tasks.

As used herein, a "module," a "unit", an "interface," a "processor," an "engine," a "detector," a "mechanism," or a "receiver," typically includes a general purpose, dedicated or shared processor and, typically, firmware or software modules that are executed by the processor. Depending upon implementation-specific or other considerations, the module, unit, interface, processor, engine, detector, mechanism or receiver, can be centralized or its functionality distributed and can include general or special purpose hardware, firmware, or software embodied in a computer-readable (storage) medium for execution by the processor. As used herein, a computer-readable medium or computer-readable storage medium is intended to include all mediums that are statutory (e.g., in the United States, under 35 U.S.C. 101), and to specifically exclude all mediums that are non-statutory in nature to the extent that the exclusion is necessary for a claim that includes the computer-readable (storage) medium to be valid. Known statutory computer-readable mediums include hardware (e.g., registers, random access memory (RAM), non-volatile (NV) storage, to name a few), but may or may not be limited to hardware.

In M-MIMO systems, the number of transmit antennas used by the access point (e.g. base station) exceeds the number of simultaneously served user equipments (UEs) to ensure data coverage via beam-forming gain. Higher ratios of transmit antennas to simultaneously served UEs may achieve increased coverage, while lower ratios of transmit antennas to simultaneously served UEs may achieve increased throughput. Thus, the network can trade throughput for coverage (and vice-versa) by adjusting the number of active UEs scheduled to receive simultaneous transmissions.

Notably, system information (e.g., control, scheduling, etc.) is generally broadcast to many users in different spatial locations, and consequently it is typically desirable to maintain a uniform wave radiation pattern (i.e. broad-beam signals) for broadcast channels so that acceptable signal to noise (SNR) ratios can be maintained over the entire cell. Conversely, unicast signals derive beam-forming gain performance benefits (i.e. with narrow-beam signals) by virtue of spatial selectivity, e.g., by achieving higher SNR ratios at the location of an intended receiver at the expense of lower SNR ratios at other locations.

A coverage gap between the broadcast and unicast channels may result if the same transmission drive circuitry (e.g., same amplifier set) is used to emit the unicast and broadcast signals. The coverage gap would be approximately equal to the M-MIMO beam-forming gain for the unicast User Equipment (UE) and the isotropic radiation pattern for the broadcast signals. Moreover, to achieve near ideal isotropic radiation patterns, the power distribution among antennas will have to be uneven, which further reduces coverage. Accordingly, techniques for allowing M-MIMO systems to efficiently communicate broadcast and unicast signals simultaneously without significant coverage gaps and/or uneven antenna power distributions are desired.

Aspects of this disclosure use multiple power amplifier sets to communicate over a M-MIMO antenna array in order to improve signal performance when simultaneously emitting unicast and broadcast signals. In some embodiments, one power amplifier set is used for amplifying broad-beam signals (e.g. broadcast signals), and another power amplifier set is used for amplifying narrow-beam signals (e.g. unicast signals). The amplified narrow-beam and broad-beam signals are then combined, e.g., using radio frequency (RF) combiners, and the combination signal is broadcast over the M-MIMO array. In one embodiment, the broad-beam signals carry system information (e.g., control, scheduling, etc.), while the narrow-beam signals carry non-system information (e.g., data, etc.). Embodiments of this disclosure maintain transmit diversity for broadcast signals without significantly impacting the beam-forming gain experienced by narrow-beam signals. In some embodiments, the broad-beam power amplifier set is turned off (or powered down) during intervals in which broad-beam signals are not being emitted. In some embodiments, the broad-beam power amplifiers may require less functionality than those used in other systems (e.g., may only need to transmit over certain sub-bands), which may allow for implementation of less complex and/or smaller power amplifiers (e.g., less expensive components) than those used in other systems, e.g., conventional M-MIMO and non-M-MIMO networks. Aspects of the disclosure may include antennas spaced significantly apart from one another in an antenna array for the broadcast signals to achieved improved diversity for broadcast information.

FIG. 1 illustrates a network 100 for communicating data. For the discussion herein, the cellular communications network is a Long Term Evolution (LTE) cellular communications network. However, the present invention is not limited thereto. The present disclosure is applicable to any type of cellular communications network or wireless communications network having a downlink channel including multiple sub-carrier frequencies over which data is communicated. In general, the network 100 comprises an access point (AP) 110. In the context of the exemplary LTE network, AP 110 may also be referred to as an enhanced node B (eNode B). Network 100 also has a coverage area 101, a plurality of mobile devices 120, and a backhaul network 130. The AP 110 may comprise any component capable of providing wireless access by, inter alia, establishing uplink (dashed line) and/or downlink (dotted line) connections with the mobile devices 120, such as a base station, an enhanced base station (eNode B), a femtocell, and other wirelessly enabled devices. The mobile devices 120 may comprise any component capable of establishing a wireless connection with the AP 110, such as a user equipment (UE), a mobile station (STA), or other wirelessly enabled devices. The backhaul network 130 may be any component or collection of components that allow data to be exchanged between the AP 110 and a remote end (not shown). In some embodiments, the network 100 may comprise various other wireless devices, such as relays, low power nodes, etc.

Figure 2:
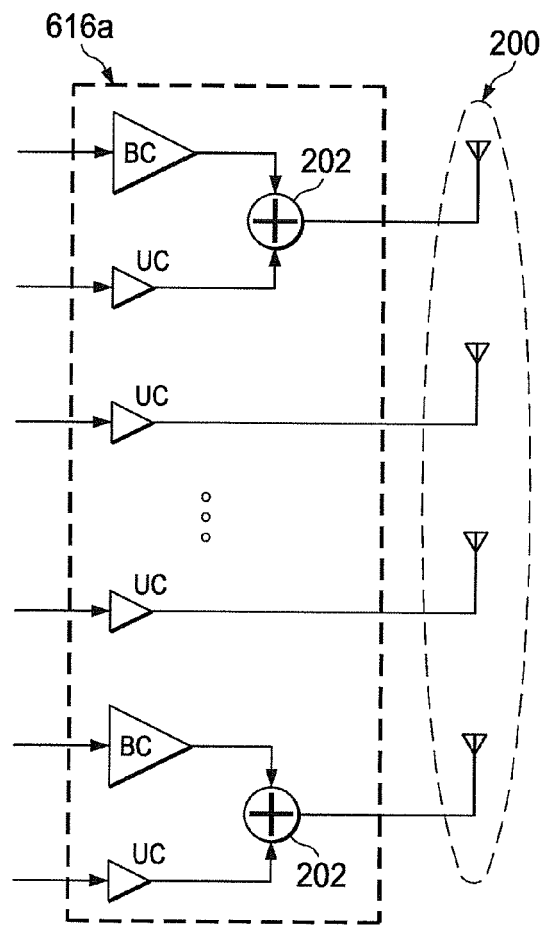
FIG. 2 illustrates a diagram of an embodiment transmitter architecture for M-MIMO.

FIG. 2 illustrates an embodiment of a power amplifier transmitter architecture 616a for M-MIMO. As shown, the embodiment transmitter architecture 616a includes different power amplifier sets for broadcast (BC) data and unicast (UC) data. In some embodiments, the UC power amplifier set includes one amplifier for each antenna in the M-MIMO array 200, and only a subset of the M-MIMO array 200 (e.g. 2 antennas) are used for transmitting the BC signal. For each antenna in this subset, only one BC PA is connected to it. Since all the antennas are used for UC data transmission, each antenna in this subset can have a UC PA (i.e. M-MIMO PA) connected to it as well. When both a BC PA and a UC PA are connected to the same antenna in the M-MIMO array 200, an RF combiner 202 is used to combine the signals before sending the signals to the respective antenna in the M-MIMO array 200.

In some embodiments, the BC power amplifier set is periodically turned off or powered down between broadcast transmissions to save power. The unicast and broadcast signals can be transmitted simultaneously. In some embodiments, the unicast and broadcast signals are communicated over different frequency bands. The BC power amplifier sets may be adapted for narrow band broadcast transmission. The UC power amplifier sets may be adapted for broadband unicast transmissions.

Figure 3:
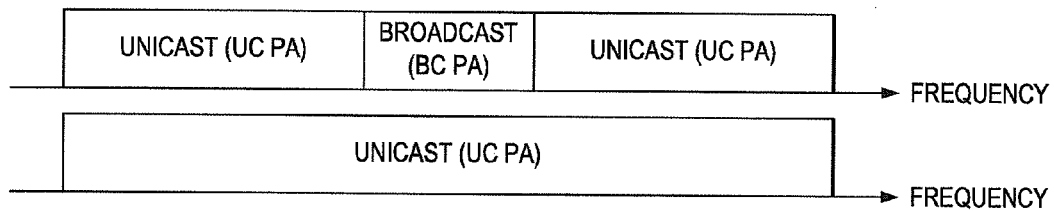
FIG. 3 illustrates diagrams of embodiment radio frequency channel structures for M-MIMO.

FIG. 3 illustrates embodiment radio frequency channel structures for M-MIMO. In the upper-most frequency channel structure, the broadcast signals are communicated via narrowband transmissions, while the unicast signals are communicated via broadband transmissions, e.g., over portions of the frequency spectrum not occupied by the broadcast signals. In some embodiments, the broadcast signals may be transmitted over fewer than all the time intervals, and the broadcast PAs may be powered down during intervals in which the broadcast signals are not communicated. In such intervals, the unicast signals may be communicated over portions of the spectrum that were otherwise reserved for the broadcast signals, as demonstrated by the lower-most frequency channel structure.

Embodiments of this disclosure use two separate PAs specifically for system wide information broadcast. In embodiments, the broadcast signal and the data signal are combined through an RF combiner 202 and then fed to the antennas. In embodiments, the PAs for the broadcast signal can be periodically turned off when not being in use.

Aspects of this disclosure provide comparable (to the data) coverage for the cell-wide system information broadcast, which may be a crucial technical component in M-MIMO networks. Embodiments may be implemented in infrastructure equipment, e.g., access-points, etc.

Figure 4:
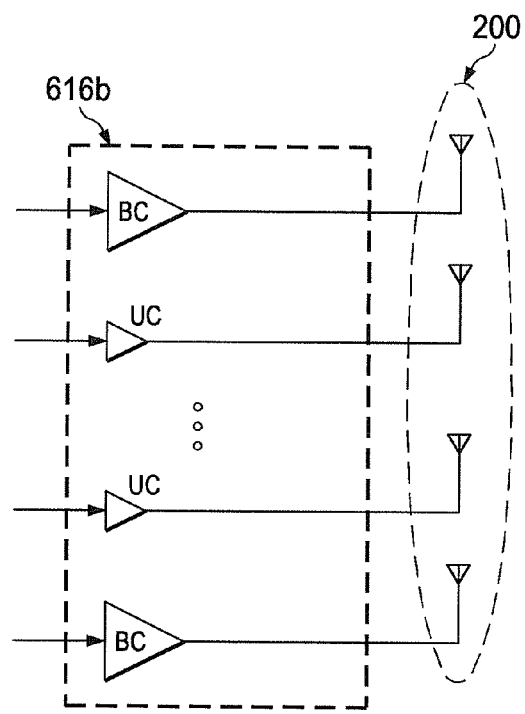
FIG. 4 illustrates a diagram of another embodiment transmitter architecture for M-MIMO.

FIG. 4 illustrates an alternative embodiment of a transmitter architecture 616b for M-MIMO. As shown, the transmitter architecture 616b uses two separate power amplifiers to achieve system wide broadcast (high power PAs for unicast as well). In this example, unicast data is transmitted over different antennas than broadcast data in the M-MIMO array.

Figure 5:
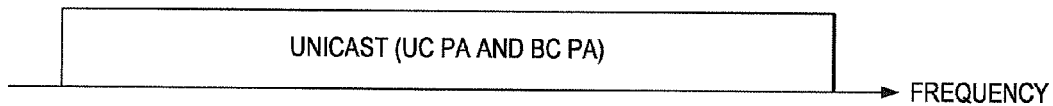
FIG. 5 illustrates a diagram of another embodiment radio frequency channel structures for M-MIMO.

FIG. 5 illustrates an embodiment of radio frequency channel structures for M-MIMO. As shown, the broadcast PAs are used for unicast transmission during intervals when the broadcast signal is not being transmitted. Such a scenario may be particularly well adapted for highly mobile UEs, as the broadcast power amplifiers can occupy a broader portion of the bandwidth when they are also used for unicast.

The PAPR is a power characteristic that defines the average output power level of a power amplifier in a transmitter relative to the peak power. A higher PAPR means that the power amplifier of the transmitter has to operate at a lower average power level. On the other hand, a low PAPR means that the power amplifier at the transmitter can operate at a higher average power level relative to the peak power. In general, the PAPR of OFDM signals x(t) is defined as the ratio between the maximum instantaneous power and its average power:

$$PAPR[x(t)] = \frac{P_{PEAK}}{P_{AVERAGE}} = 10\log_{10}\frac{\max[|X(n)|^2]}{E[|x_n|^2]}$$

where $P_{PEAK}$ represents the peak output power and $P_{AVERAGE}$ represents the average output power. $E[\bullet]$ denotes the expected value, $x_n$ represents the transmitted OFDM signals which are obtained by taking an Inverse Fast Fourier Transform (IFFT) operation on modulated input symbols $x_k$. $x_n$ is expressed as:

$$x_n = \frac{1}{\sqrt{N}}\sum_{K=0}^{N-1} X_k W_N^{nk}$$

Where W represents the so-called "twiddle factor" wherein W=exp(-j2π/N), where j=sqrt(-1).

A low PAPR sequence refers to a collection of information that has a relatively good autocorrelation characteristic. Ideally, the autocorrelation of a low PAPR sequence is the autocorrelation provided by a delta impulse function (also referred to as a Dirac delta function). One example of such a low PAPR sequence is a Zadoff-Chu sequence. A Zadoff-Chu sequence is a complex-valued mathematical sequence which, when applied to a signal to be communicated wirelessly, results in an electromagnetic signal of constant amplitude. Other low PAPR sequences can also be used, including binary sequences with a low PAPR. Another example of a low PAPR sequence is a Golay complementary sequence. A Golay complementary sequence has the property that their Fourier transform has a PAPR of at most 2, which is equivalent to 3 dB. Other low PAPR sequences include so called Discrete Fourier Transform Spread Orthogonal Frequency Division Multiplexing (DFT-S-OFDM) (also known as single carrier FDMA in LTE).

Figure 8:
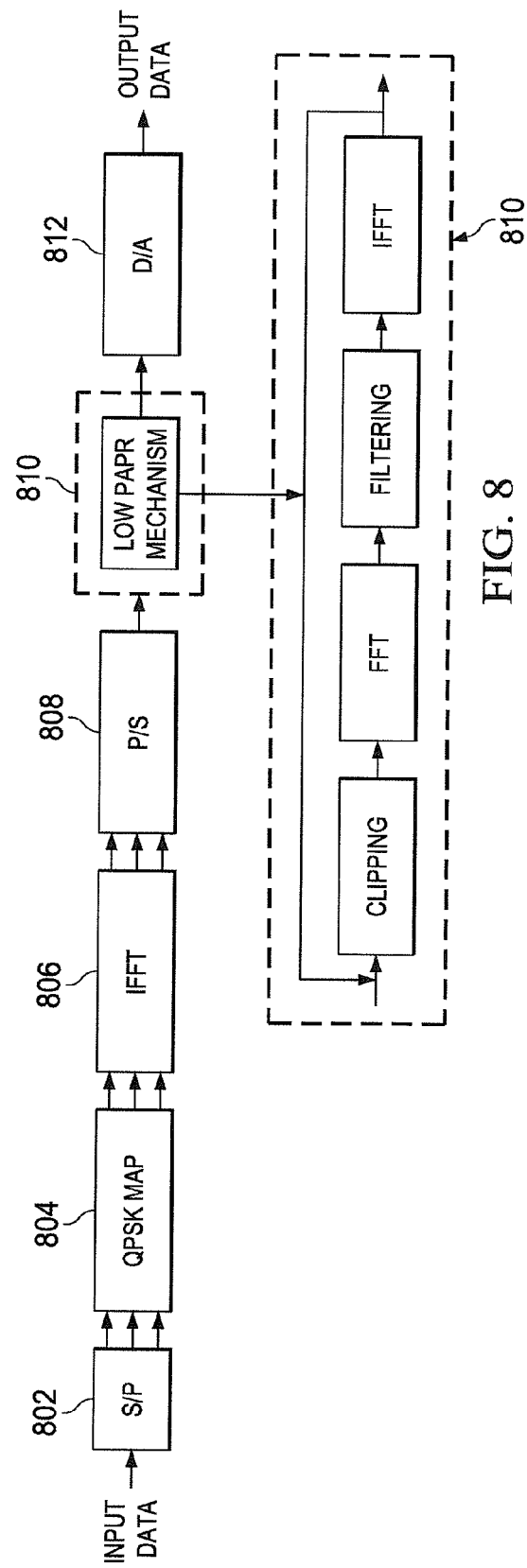
FIG. 8 illustrates an exemplary block diagram of a system employing iterative clipping and filtering (ICF) as a low PAPR mechanism; and, FIG. 9 illustrates an exemplary flow diagram of iterative clipping and filtering (ICF) using FFT/IFFT.

Reference is now made to FIG. 8 illustrating an exemplary block diagram of a system employing iterative clipping and filtering (ICF) as a low PAPR mechanism. Input data is converted from a serial stream to a parallel output with serial to parallel converter 802. QPSK mapper 804 modulates the parallel data representation and IFFT module 806 performs an Inverse Fast Fourier transform on the QPSK modulated data. Parallel to serial converter 808 converts the parallel output of the IFFT module 806 back to a serial data stream for presentation to the low PAPR mechanism 810. The low PAPR mechanism 810 (described in more detail herein below) has an input coupled to the parallel to serial converter 808 and an output coupled to a digital to analog converter 812.

Figure 9:
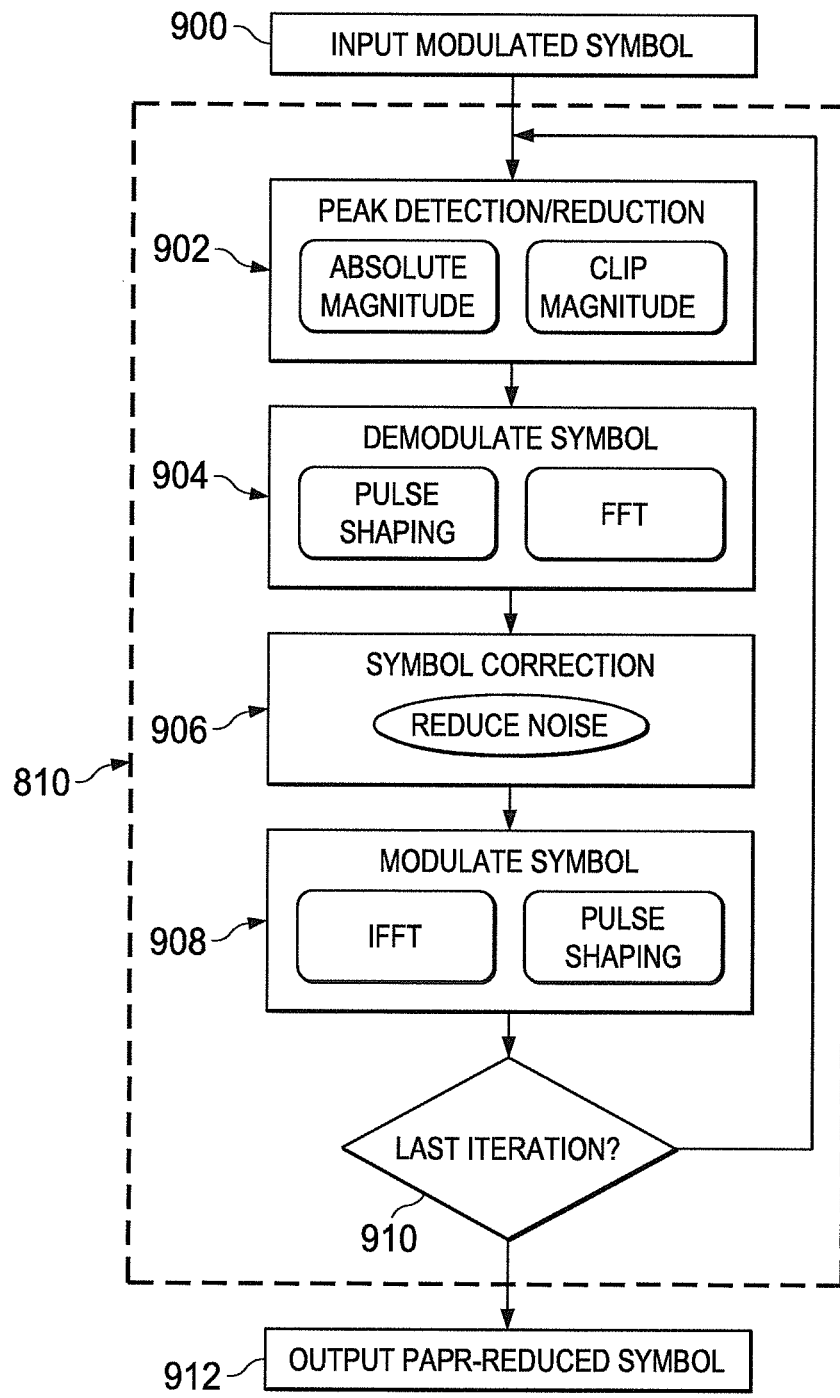

Reference is now made to FIG. 9 illustrating an exemplary flow diagram of the steps for iterative clipping and filtering (ICF) module 810 using FFT/IFFT. It should be appreciated that those skilled in the art will recognize other low PAPR clipping and filtering mechanisms (e.g. using DCT/IDCT transforms) without departing from the scope of the present disclosure.

At step 900, the modulated symbol from parallel to serial converter 808 is coupled to the iterative clipping and filtering (ICF) module 810 and the number of iterations is set.

The peak of the incoming symbol is detected, and the clipping level is calculated for generating a symbol with clipped magnitude at step 902. At step 904, the clipped magnitude symbol is converted to a frequency domain signal using a FFT. Step 906 filters the signal from step 904 to reduce noise. The output from step 906 is converted into the time domain by using an IFFT. If the number of iterations set at step 900 is met, step 912 outputs the low PAPR symbol, otherwise another iteration of steps 902-910 is made.

The term "low" or "reduced" PAPR in the context of OFDMA-based communications refers to any PAPR that is reduced according to a PAPR reduction mechanism (such as by using clipping and filtering or any of the sequences discussed above) such that the PAPR associated with the OFDMA-based communications is lower or reduced when compared to conventional OFDMA-based communications that are associated with relatively high PAPR. In some implementations, the low PAPR that can be achieved using techniques according to some embodiments is on the order of the PAPR provided by a single-carrier, frequency division multiple access (SC-FDMA) communications system. However, the low PAPR that can be achieved in OFDMA communications can be accomplished without having to apply a Digital Fourier Transform (DFT) to spread data over multiple sub-carriers, as performed with SC-FDMA. As will be appreciated by those skilled in the art, all PAPR reduction algorithms add a certain degree of complexity. DFT spreading however requires that all data be spread in one sub-band.

Information to be transmitted may also be mapped to a selected at least one of the pool of low PAPR sequences. The selected at least one low PAPR sequence is then modulated and transmitted wirelessly over the OFDMA-based wireless link.

PSS and SSS

For the embodiment where the cellular communications network is an LTE network, an Orthogonal Frequency Division Multiple Access (OFDMA) channel is used as a downlink channel between the access point 110 and the UEs 120, and a Single-Carrier Frequency Division Multiple Access (SC-FDMA) channel is used as an uplink channel for uplinks from the UEs 120 to the access point 110. As will be appreciated by one of ordinary skill in the art, both OFDMA and SC-FDMA are digital multi-carrier modulation schemes by which a number of closely-spaced sub-carrier frequencies are used to carry data. Thus, for both an OFDMA channel and an SC-FDMA channel, a bandwidth (referred to herein as a full bandwidth) of the channel includes a number of sub-bands having corresponding sub-carrier frequencies.

In order to provide a power boost for a downlink to a UE, the access point 110 identifies a subset of the sub-carrier frequencies in the full bandwidth of the downlink channel as a reduced bandwidth channel for the downlink to the UE 120.

In the case of PSS and SSS common broadcast signals, only the central sixty-two subcarriers need to be transmitted. Accordingly, the PA requirement (relative to the PAs in the M-MIMO array) equals:

$$G_A - 10*\log(N_{SC}/62) \text{ (dB)}$$

Where $G_A$ is the beam-forming gain and $N_{sc}$ is the number of total subcarriers in the system. For example, for a 10 MHz system in LTE, $N_{SC}=600$.

FIG. 3 depicts PSS and SSS common broadcast signals being transmitted in accordance with the principles of the present disclosure over the narrow band of sixty-two sub-carriers. By using the reduced bandwidth channel for the downlink and by transmitting at full transmit power or substantially full transmit power, transmit power density, or signal power density, is concentrated on the sixty-two sub-carrier frequencies in the reduced bandwidth channel rather than spread across the sub-carrier frequencies in the full bandwidth of the downlink channel. As a result, a power boost is provided for the downlink to the UE 120.

Vector hopping can be used to introduce transmit diversity. Precoding vector hopping is a known transmit diversity scheme in which each symbol is multiplied by a constant, which would not affect the low PAPR property. The weighting of the two antennas preferably alternates between $[+1, +1]^T$ and $[+1, -1]^T$ from subframe to subframe, and is reset at the beginning of a new radio frame, wherein T denotes vector transpose.

Preferably, PSS and SSS are transmitted from the same antenna port in any given subframe. However, between different subframes they are preferably transmitted from different antenna ports thus benefiting from time-switched antenna diversity. It should be noted that the antenna ports do not necessarily correspond to physical antennas, but rather are logical entities distinguished by their reference signal sequences. Multiple antenna port signals can be transmitted on a single transmit antenna. Correspondingly, a single antenna port can be spread across multiple transmit antennas.

PBCH

Similarly, since the broadcast PAs only need to transmit in the central seventy-two subcarriers for PBCH, the PA requirement (relative to the PAs in the M-MIMO array) equals:

$$G_A - 10*\log(N_{SC}/72) \text{ (dB)}.$$

Where $G_A$ is the beam-forming gain and $N_{sc}$ is the number of total subcarriers in the system. For example, for a 10 MHz system in LTE, $N_{SC}=600$.

DFT-S-OFDM with space-time block coding based transmit diversity (STTD) can be used to reduce PAPR in PBCH. DFT-S-OFDM has very low PAPR for Quadrature Phase Shift Keying (QPSK) modulation and negligible performance degradation from DFT-S-OFDM transmission is observed. The seventy-two subcarriers cover an almost flat channel. PBCH is preferably designed for the worst case UE, where degradation of STTD due to UE mobility is small.

Space time transmit diversity (STTD) is a method of obtaining transmit diversity utilizing space time block code (STBC) in order to exploit redundancy in multiple transmitted versions of a signal. One aim of STTD is to smooth the Rayleigh fading and drop out effects observed when using only a single antenna at both ends of a radio link in a multipath propagation environment. Diversity improves link reliability for each UE, especially near cell edges and also the average performance of an ensemble of users at any particular instant. STTD is applied to subcarrier symbols taking consecutive pairs of data symbols {S1, S2}, normally sent directly from one antenna. For two transmit antennas the symbols {S1, S2} are transmitted unchanged from antenna #1 while simultaneously from antenna #2 is sent the sequence {−S2*, S1*}.

PDCCH and PDSCH

OFDM is used with aggressive PAPR reduction (due to QPSK modulation) and Space-Frequency Transmit Diversity (SFTD) for robust transmission. In so called SFTD—sometimes referred to as Space-Frequency Block Coding (SFBC), a block of consecutive symbols (e.g. $a_0$, $a_1$, $a_2$, $a_3$, . . . ) are directly mapped to OFDM subcarriers of the first antenna and the negative complex conjugate versions of the same modulated symbols changed in order for a pair of symbols (e.g. $-a^*_1$, $a^*_0$, $-a^*_3$, $a^*_2$) are mapped on the corresponding subcarriers of the second antenna. PAPR reduction can be "more aggressive" because even though UE transparent PAPR reduction usually causes larger Error Vector Magnitude (EVM), PDCCH and PDSCH use QPSK modulation and QPSK modulation is able to endure larger EVM. UE transparent PAPR reduction refers to the fact that a UE does not need to know what PAPR reduction technique is used at the transmitter to receive the data.

EVM is a measure used to quantify the performance of a transmitter (or receiver). A signal sent by an ideal transmitter or received by an ideal receiver would have all constellation points precisely at the ideal locations, however various imperfections in the implementation (such as carrier leakage, low image rejection ratio, phase noise etc.) cause the actual constellation points to deviate from the ideal locations. Informally, EVM is a measure of how far the points are from the ideal locations.

Since noise, distortion, spurious signals, and phase noise all contribute to the deviation of the constellation points from the ideal location, EVM therefore provides a comprehensive measure of the quality of the radio receiver or transmitter for use in digital communications. One of the stages in a typical phase-shift keying demodulation process produces a stream of I-Q points which can be used as a reasonably reliable estimate for the ideal transmitted signal in EVM calculation.

For PAPR reduction mechanisms such as clipping and filtering, the EVM is determined by how severely the signals are clipped. The more severely the signals are clipped, the lower the PAPR, but the higher the EVM. Since QPSK can endure more severe EVM than higher modulations, more clipping can be done, or alternatively stated—lower PAPR can be achieved. The phrase "more aggressive" refers to more reduction in PAPR. Usually when PAPR reduction is performed the modulation order for a given signal is not known. When the signal is known to be QPSK, lower PAPR can be achieved at the cost of higher EVM. The phrase "more aggressive" is relative to the modest PAPR reduction when the modulation order of the signal is not known.

Figure 6:
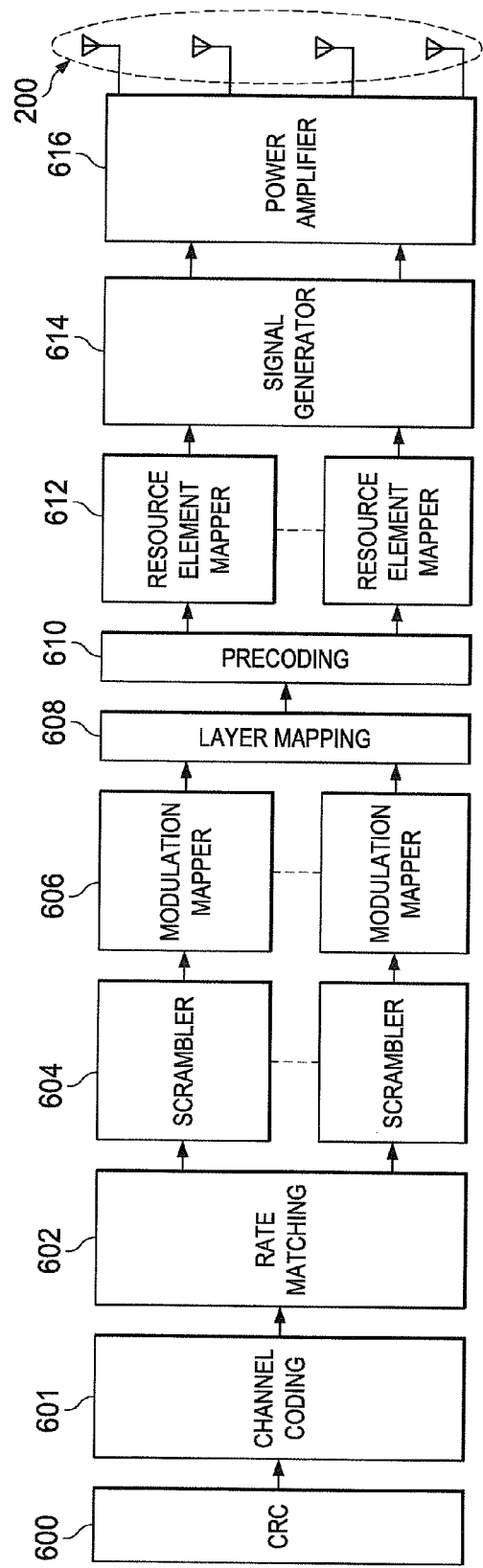
FIG. 6 illustrates a physical layer diagram of a platform that may be used for implementing the devices and methods described herein, in accordance with an embodiment.

Reference is now made to FIG. 6 depicting an exemplary but not exclusive physical layer diagram of a platform that may be used for implementing systems, devices and methods described herein, in accordance with embodiments.

Transport block data is passed through a cyclic redundancy check (CRC) module 600 for error detection. The CRC module 600 appends a CRC code to the transport block data received from a MAC layer before being passed through the physical layer. The transport block is divided by a cyclic generator polynomial to generate parity bits. These parity bits are then appended to the end of transport block.

The physical layer comprises a channel coding module 601, a rate matching module 602, a scrambler module 604, a modulation mapper module 606, a layer mapping module 608, a precoding module 610, a resource element mapper 612, a signal generator (OFDMA) module 614, and a power amplifier module 616.

Channel coding module 601 turbo codes the data with convolutional encoders having certain interleaving between them. The rate matching module 602 acts as a rate coordinator or buffer between preceding and succeeding transport blocks. The scrambler module 604 produces a block of scrambled bits from the input bits.

Resource elements and resource blocks (RBs) make a physical channel. A RB is a collection of resource elements. A resource element is a single subcarrier over one OFDM symbol, and carries multiple modulated symbols with spatial multiplexing. In the frequency domain, a RB represents the smallest unit of resources that can be allocated. In LTE-A, a RB is a unit of time frequency resource, representing 180 KHz of spectrum bandwidth for the duration of a 0.5 millisecond slot.

Modulation mapper module 606 maps the bit values of the input to complex modulation symbols with the modulation scheme specified. In one embodiment, the modulation scheme is Discrete Fourier Transform Spread Orthogonal Frequency Division Multiplexing (DFT-S-OFDM). In another embodiment, the modulation scheme is OFDM with aggressive PAPR reduction.

Spatial multiplexing creates multiple streams of data to individual UEs on a single resource block (RB) effectively reusing each RB a number of times and thus increases spectral efficiency. Layer mapper module 608 splits the data sequence into a number of layers.

Precoding module 610 is based on transmit beam-forming concepts allowing multiple beams to be simultaneously transmitted in the M-MIMO system by a set of complex weighting matrices for combining the layers before transmission. Vector hopping is preferably used for transmit diversity. Precoding module 610 preferably vector hops with the weighting of the two antennas alternating between $[+1, +1]^T$ and $[+1, -1]^T$ from subframe to subframe, and resetting at the beginning of a new radio frame.

The resource element mapping module 612 maps the data symbols, the reference signal symbols and control information symbols into a certain resource element in the resource grid.

Signal Generator 614 is coupled between the resource element mapping module 612 and the PA array 616. The PA array 616 drives the antenna array 200 and preferably has a form substantially that of either PA array 616a or 616b depicted in FIGS. 2 and 4, respectively.

The PA array 616 transmits the common broadcast channels (e.g. PSS, SSS, PBCH, PDCCH and PDSCH) over a narrow sub-band resource as depicted in FIG. 3. Discrete Fourier Transform Spread Orthogonal Frequency Division Multiplexing (DFT-S-OFDM) or OFDM is preferably used with aggressive PAPR reduction for the broadcast signal to further lower the rating requirement of the dedicated PAs within the PA array 616.

Figure 7:
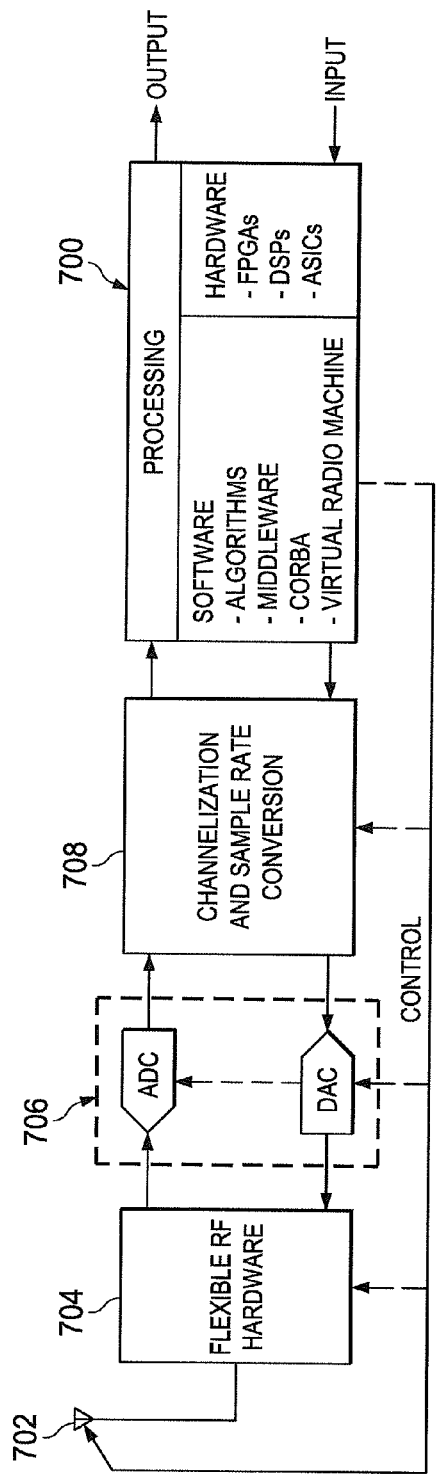
FIG. 7 illustrates an exemplary block diagram of a mobile device for practicing principles of the present disclosure.

Reference is now made to FIG. 7 illustrating an exemplary block diagram of a mobile device for practicing principles of the present disclosure.

A processing module 700 performs radio baseband functions. These functions can be carried out using a number of different implementations including Digital Signal Processors (DSPs), Field Programmable Gate Arrays (FPGAs), Application Specific Integrated Circuits (ASICs), general purpose processors, software, or a combination thereof. The methods used to modulate and demodulate the input and outputs signals may use a variety of methodologies, including but not limited to, middleware, e.g., common object request broker architecture (CORBA), or virtual radio machines, which are similar in function to JAVA virtual machines. Processing module 700 performs the methods of receiving broad-beam signals from a transmitter over a frequency band which is much narrower than an available bandwidth and demodulating the broad-beam signals to extract content, in accordance with principles of the present disclosure. The demodulator preferably demodulates Discrete Fourier Transform Spread Orthogonal Frequency Division Multiplexing (DFT-S-OFDM) coded signals.

An antenna or antennas 702 provides gain versus direction characteristic to minimize interference, multipath, and noise.

The RF signal is picked up by the antenna(s) 702, filtered, amplified with a low noise amplifier (LNA), and down converted with a local oscillator (LO) to baseband (or IF) by flexible RF hardware 704. The incoming signal is digitizing with an analog to digital converter (ADC) 706. Similarly, an outgoing digital signal is converted to analog by digital to analog converter (DAC) 706. Digital filtering (channelization) and sample rate conversion are provided by module 708 to interface the output of the ADC 706 to the processing module 700. Likewise, module 708 provides digital filtering and sample rate conversion to interface the processing module 700 that creates the modulated waveforms to the digital to analog converter 706.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of transmitting with a Multiple-Input Multiple-Output (MIMO) transmitter to User Equipment (UE) comprising:
   obtaining a low Peak-to-Average-Power-Ratio (PAPR) broadcast signal and a unicast signal;
   amplifying the low PAPR broadcast signal at a first power amplifier of the MIMO transmitter;
   amplifying the unicast signal at a second power amplifier of the MIMO transmitter;
   transmitting the amplified unicast signal;
   transmitting the amplified low PAPR broadcast signal in less than all time intervals in which the transmitter transmits; and
   powering down the first power amplifier during time intervals in which the amplified low PAPR broadcast signal is not transmitted.

2. The method of claim 1 wherein the low PAPR broadcast signal is obtained by applying a Zadoff-Chu sequence to a signal to be communicated wirelessly.

3. The method of claim 1 wherein the low PAPR broadcast signal is obtained by applying a Golay complementary sequence to a signal to be communicated wirelessly.

4. The method of claim 1 wherein the low PAPR broadcast signal comprises a Primary Synchronization Signal.

5. The method of claim 4 wherein the Primary Synchronization Signal is transmitted over a central 62 subcarriers of an available bandwidth.

6. The method of claim 1 wherein the low PAPR broadcast signal comprises a Secondary Synchronization Signal.

7. The method of claim 6 wherein the Secondary Synchronization Signal is transmitted over a central 62 subcarriers of an available bandwidth.

8. The method of claim 1 wherein the low PAPR broadcast signal comprises a Physical Broadcast Control Channel signal.

9. The method of claim 8 wherein the Physical Broadcast Control Channel signal is transmitted over a central 72 subcarriers of an available bandwidth.

10. The method of claim 8 wherein Discrete Fourier Transform Spread Orthogonal Frequency Division Multiplexing (DFT-S-OFDM) is used to achieve a low PAPR in the low PAPR broadcast signal.

11. The method of claim 10 further comprising using the DFT-S-OFDM with Space-Time block coding based Transmit Diversity (STTD).

12. The method of claim 1 wherein the low PAPR broadcast signal comprises a Physical Downlink Control Channel signal.

13. The method of claim 12 further comprising applying Orthogonal Frequency Division Multiplexing (OFDM) and Space-Frequency Transmit Diversity (SFTD) to the Physical Downlink Control Channel signal.

14. The method of claim 13 further comprising applying QPSK with iterative clipping to the low PAPR broadcast signal to further reduce the PAPR of the low PAPR broadcast signal.

15. The method of claim 1 wherein the low PAPR broadcast signal comprises a Physical Downlink Shared Channel signal.

16. The method of claim 15 further comprising applying Orthogonal Frequency Division Multiplexing (OFDM) and Space-Frequency Transmit Diversity (SFTD) to the Physical Downlink Shared Channel signal.

17. The method of claim 16 further comprising applying QPSK with iterative clipping to the low PAPR broadcast signal to further reduce the PAPR of the low PAPR broadcast signal.

18. The method of claim 1 wherein the MIMO transmitter has a number of antennas greater than a number of the UE serviced by the transmitter.

19. The method of claim 1 further comprising, during time intervals in which the amplified low PAPR broadcast signal is not transmitted, transmitting the unicast signal over a portion of a frequency spectrum in which the amplified low PAPR broadcast signal is transmitted when the amplified low PAPR broadcast signal is transmitted.

20. A Multiple-Input Multiple-Output (MIMO) transmitter for transmitting to User Equipment (UE), comprising:
    a first power amplifier configured to amplify a low Peak-to-Average-Power-Ratio (PAPR) broadcast signal to generate an amplified low PAPR broadcast signal;
    a second power amplifier configured to amplify a unicast signal to generate an amplified unicast signal;
    at least one antenna in communication with the first power amplifier and the second power amplifier, the at least one antenna configured to transmit the amplified low PAPR broadcast signal and transmit the amplified unicast signal;
    a non-transitory memory storage comprising instructions; and
    one or more processors in communication with the non-transitory memory storage, wherein the one or more processors execute the instructions to:
    cause the at least one antenna to transmit the amplified low PAPR broadcast signal in less than all time intervals in which the transmitter transmits; and
    power down the first power amplifier during time intervals in which the amplified low PAPR broadcast signal is not transmitted.

21. The transmitter of claim 20 wherein the low PAPR broadcast signal is obtained by applying a Zadoff-Chu sequence to a signal to be communicated wirelessly.

22. The transmitter of claim 20 wherein the low PAPR broadcast signal is obtained by applying a Golay complementary sequence to a signal to be communicated wirelessly.

23. The transmitter of claim 20 wherein the low PAPR broadcast signal comprises a Primary Synchronization Signal.

24. The transmitter of claim 23 wherein the Primary Synchronization Signal is transmitted over a central 62 subcarriers of an available bandwidth.

25. The transmitter of claim 20 wherein the low PAPR broadcast signal comprises a Secondary Synchronization Signal.

26. The transmitter of claim 25 wherein the Secondary Synchronization Signal is transmitted over a central 62 subcarriers of an available bandwidth.

27. The transmitter of claim 20 wherein the low PAPR broadcast signal comprises one of a Physical Broadcast Control Channel signal, Physical Downlink Control Channel signal, or Physical Downlink Shared Channel signal.

28. The transmitter of claim 20 wherein the one or more processors further execute the instructions to apply Orthogonal Frequency Division Multiplexing (OFDM) and Space-Frequency Transmit Diversity (SFTD) to achieve a low PAPR in the low PAPR broadcast signal.

29. The transmitter of claim 20 wherein the one or more processors further execute the instructions to apply QPSK with iterative clipping to achieve a low PAPR in the low PAPR broadcast signal.

30. The transmitter of claim 20 wherein the transmitter has a number of antennas greater than a number of the UE serviced by the transmitter.

31. The transmitter of claim 20 wherein the one or more processors further execute the instructions to, during time intervals in which the amplified low PAPR broadcast signal is not transmitted, transmit the unicast signal over a portion of a frequency spectrum in which the amplified low PAPR broadcast signal is transmitted when the amplified low PAPR broadcast signal is transmitted.

* * * * *